US010032726B1

United States Patent
Baloglu et al.

(10) Patent No.: US 10,032,726 B1
(45) Date of Patent: Jul. 24, 2018

(54) EMBEDDED VIBRATION MANAGEMENT SYSTEM

(71) Applicant: Amkor Technology, Inc., Tempe, AZ (US)

(72) Inventors: Bora Baloglu, Chandler, AZ (US); Adrian Arcedera, Chandler, AZ (US); Marc Alan Mangrum, Manchaca, TX (US); Russell Shumway, Mesa, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 0 days.

(21) Appl. No.: 14/069,814

(22) Filed: Nov. 1, 2013

(51) Int. Cl.
H01L 23/495 (2006.01)
H01L 23/00 (2006.01)

(52) U.S. Cl.
CPC ............ H01L 23/562 (2013.01); H01L 24/96 (2013.01)

(58) Field of Classification Search
CPC ............... H01L 23/49541; H01L 21/56; H01L 23/49575; H01L 23/495; H01L 23/49861; H01L 23/49565; H01L 2924/181; H01L 2224/49171; H01L 2224/48227; H01L 33/62; H01L 23/28; H01L 23/498
USPC .......... 257/676, E23.043, E21.502, E23.031, 257/666, E23.054; 438/112, 123, 124, 438/127
See application file for complete search history.

(56) References Cited

U.S. PATENT DOCUMENTS

| 5,049,976 | A | * | 9/1991 | Demmin | H01L 23/49503 257/717 |
|---|---|---|---|---|---|
| 5,647,124 | A | * | 7/1997 | Chan | H01L 23/49541 174/551 |
| 6,965,157 | B1 | * | 11/2005 | Perez | H01L 21/4842 257/666 |
| 8,203,164 | B2 | | 6/2012 | Min et al. | |
| 8,358,013 | B1 | * | 1/2013 | Liou | H01L 23/3107 257/777 |
| 2009/0051016 | A1 | * | 2/2009 | Galesic | H01L 23/24 257/669 |
| 2010/0178734 | A1 | * | 7/2010 | Lin | H01L 21/4828 438/123 |

(Continued)

Primary Examiner — Khiem D Nguyen
(74) Attorney, Agent, or Firm — McAndrews, Held & Malloy, Ltd.

(57) ABSTRACT

Methods for an embedded vibration management system are disclosed and may include fabricating a semiconductor package that supports vibration management by forming an array of vibration absorbing structures, placing the array proximate to a leadframe comprising two-legged supported leads, placing a semiconductor device above the leadframe, and encapsulating the semiconductor device and the leadframe. Each vibration absorbing structure may comprise a mass element formed on a material with lower density than that of the mass element. The array may be placed on a top, a bottom, or both surfaces of the leadframe. Sections of the array may be placed symmetrically with respect to the semiconductor device. The vibration absorbing structures may be cubic in shape and may be enclosed in an encapsulating material. The two-legged supported leads may be formed by bending metal strips with holes. The vibration absorbing structures may be exposed to the exterior of the semiconductor package.

23 Claims, 9 Drawing Sheets

(56) References Cited

U.S. PATENT DOCUMENTS

| | | | |
|---|---|---|---|
| 2011/0278711 A1* | 11/2011 | Cho | H01L 21/4832 257/676 |
| 2012/0025227 A1* | 2/2012 | Chan et al. | 257/89 |
| 2013/0087826 A1* | 4/2013 | Kim | 257/99 |
| 2013/0099274 A1* | 4/2013 | Seo et al. | 257/99 |

* cited by examiner

EMBEDDED VIBRATION MANAGEMENT SYSTEM

FIELD

Certain embodiments of the disclosure relate to semiconductor chip packaging. More specifically, certain embodiments of the disclosure relate to an embedded vibration management system.

BACKGROUND

Semiconductor packaging protects integrated circuits, or chips, from physical damage and external stresses. In addition, it can provide a thermal conductance path to efficiently remove heat generated in a chip, and also provide electrical connections to other components such as printed circuit boards, for example. Materials used for semiconductor packaging typically comprise ceramic or plastic, and form-factors have progressed from ceramic flat packs and dual in-line packages to pin grid arrays and leadless chip carrier packages, among others.

Further limitations and disadvantages of conventional and traditional approaches will become apparent to one of skill in the art, through comparison of such systems with the present disclosure as set forth in the remainder of the present application with reference to the drawings.

DETAILED DESCRIPTION

Certain aspects of the disclosure may be found in semiconductor package having an embedded or integrated vibration management system. Example aspects of the disclosure may comprise fabricating a semiconductor package, where the fabricating comprises: forming an array of vibration absorbing structures; placing the array of vibration absorbing structures proximate to a leadframe comprising two-legged supported leads; placing a semiconductor device above the leadframe; and encapsulating the semiconductor device and the leadframe. Each vibration absorbing structure may comprise a mass element formed on a material with lower density than the material of the mass element. The array of vibration absorbing structures may be placed on a top surface, on a bottom surface or both the top and bottom surfaces of the leadframe. Sections of the array of vibration absorbing structures may be placed symmetrically with respect to the semiconductor device. The vibration absorbing structures may be cubic in shape. The vibration absorbing structures may be enclosed in an encapsulating material. The two-legged supported leads may be formed by bending metal strips with holes. The vibration absorbing structures may be exposed to the exterior of the semiconductor package.

Figure 1:
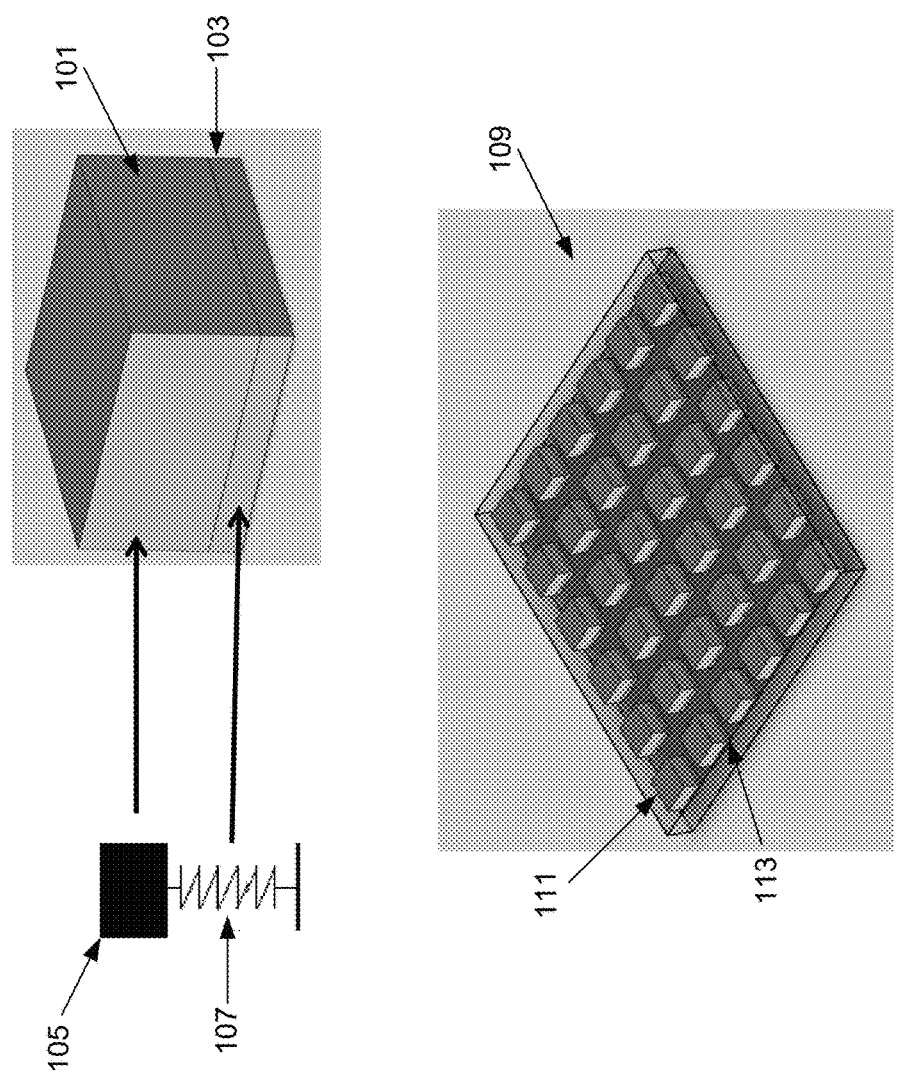
FIG. 1 is a drawing illustrating a vibration absorbing structure, in accordance with an example embodiment of the disclosure.

FIG. 1 is a drawing illustrating a vibration absorbing structure, in accordance with an example embodiment of the disclosure. Referring to FIG. 1, there is shown a dense material 101 adjacent to a softer material 103. In terms of physical vibrations, this structure may be represented by a mass 105 for the dense material 101 and a spring 107 for the softer material 103. Such a structure may be formed in an array, illustrated by the array 109 of mass elements 111 on the soft material layer 113. While the mass elements 111 are shown as cubic structures, the disclosure is not so limited. For example, the mass elements may be spherical, conical, or pyramidal in shape.

The array 109 may act as a vibration absorbing structure for the package in which it is integrated, and may be attached to a leadframe, for example, in a semiconductor package. The array 109 may dampen vibrations by extracting energy from the motion imparted to the structure. For example, the array 109 may be integrated within an integrated circuit package. In instances where the package is exposed to vibration, such as in the normal use of a cell phone or a package in a motor vehicle, for example, the mass elements 111 in the array 109 may absorb the mechanical energy and vibrate themselves, such that vibration energy is directed away from the integrated circuits in operation.

Various techniques may be utilized to manage vibration in a structure. First, structural stiffening may be used to push the fundamental resonance frequency of the structure above that of the primary source or sources of excitation. This may be analogized to more solid and substantial legs on a table, and may be applied to integrated circuit packages with stronger leads, as shown in FIGS. 6-9.

Second, vibration isolation may be used to reduce stress on a structure caused by vibration. This may comprise a spring-like interface placed between a fixed source of vibration and the supporting structure. This attenuates the vibration before it enters the structure. An example of this type of this technique is spring-loaded feet in a phonograph turntable.

Finally, vibration dampening may reduce vibration intensity by absorbing energy from the mechanical energy of the vibration. For example, fluid viscous dampers or tuned-mass dampers may absorb vibration energy, as illustrated by the integrated dampening structures shown in FIGS. 1-5.

Figure 2:
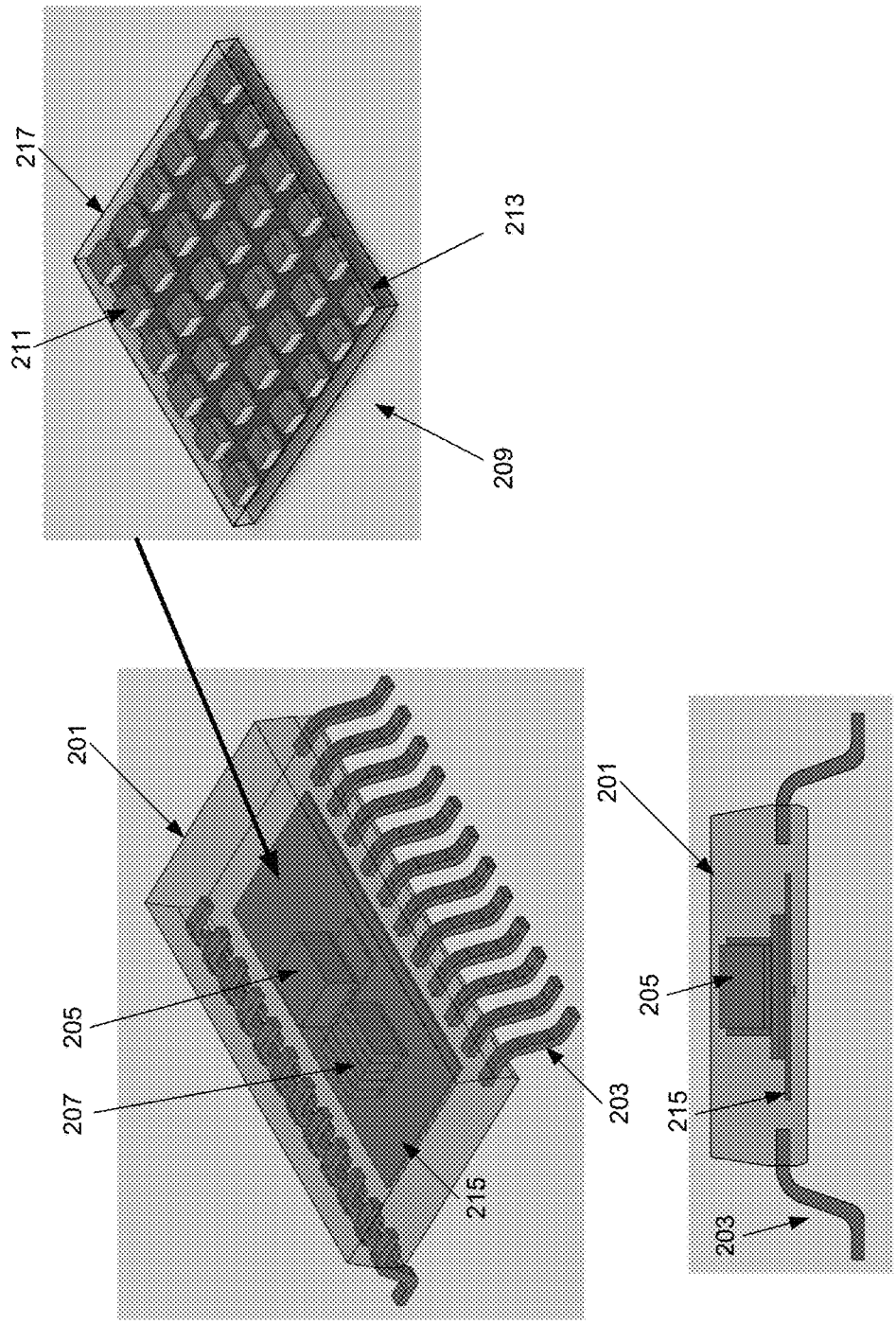
FIG. 2 is a drawing illustrating an array of vibration absorbing structures in an integrated circuit package, in accordance with an example embodiment of the disclosure.

FIG. 2 is a drawing illustrating an array of vibration absorbing structures in an integrated circuit package, in accordance with an example embodiment of the disclosure. Referring to FIG. 2, there is shown the integrated circuit (IC) package 201 comprising a leadframe 215 with an array 209 of mass elements 211 formed on a softer material layer 213 and within encasing material 217, thereby forming a closed "box" vibration absorbing structure. There is also shown an integrated circuit 205, leads 203, and discrete devices 207.

In an example scenario, the array 209 may act as a vibration absorbing structure in the IC package 201, and may be attached to the leadframe 215, that may be used to form the leads 203, for example. The array 209 may dampen vibrations by extracting energy from motion imparted to the IC package 201.

The array 209 may be placed on the leadframe 215 prior to molding, and since the array 209 comprises a closed box vibration absorbing structure, the leadframe 215 may be molded including the boxed array 209 as well. The array may be placed on top, bottom, or both surfaces of the leadframe 215, and may be encased within the package 201 or may be exposed to the exterior of the package, for example in applications where the encapsulant is not formed on the bottom surface of the leadframe 215 thereby exposing the array placed on the bottom surface of the leadframe 215. In another example scenario, a hole or window may be formed in the package 201 exposing the array 209.

Figure 3:
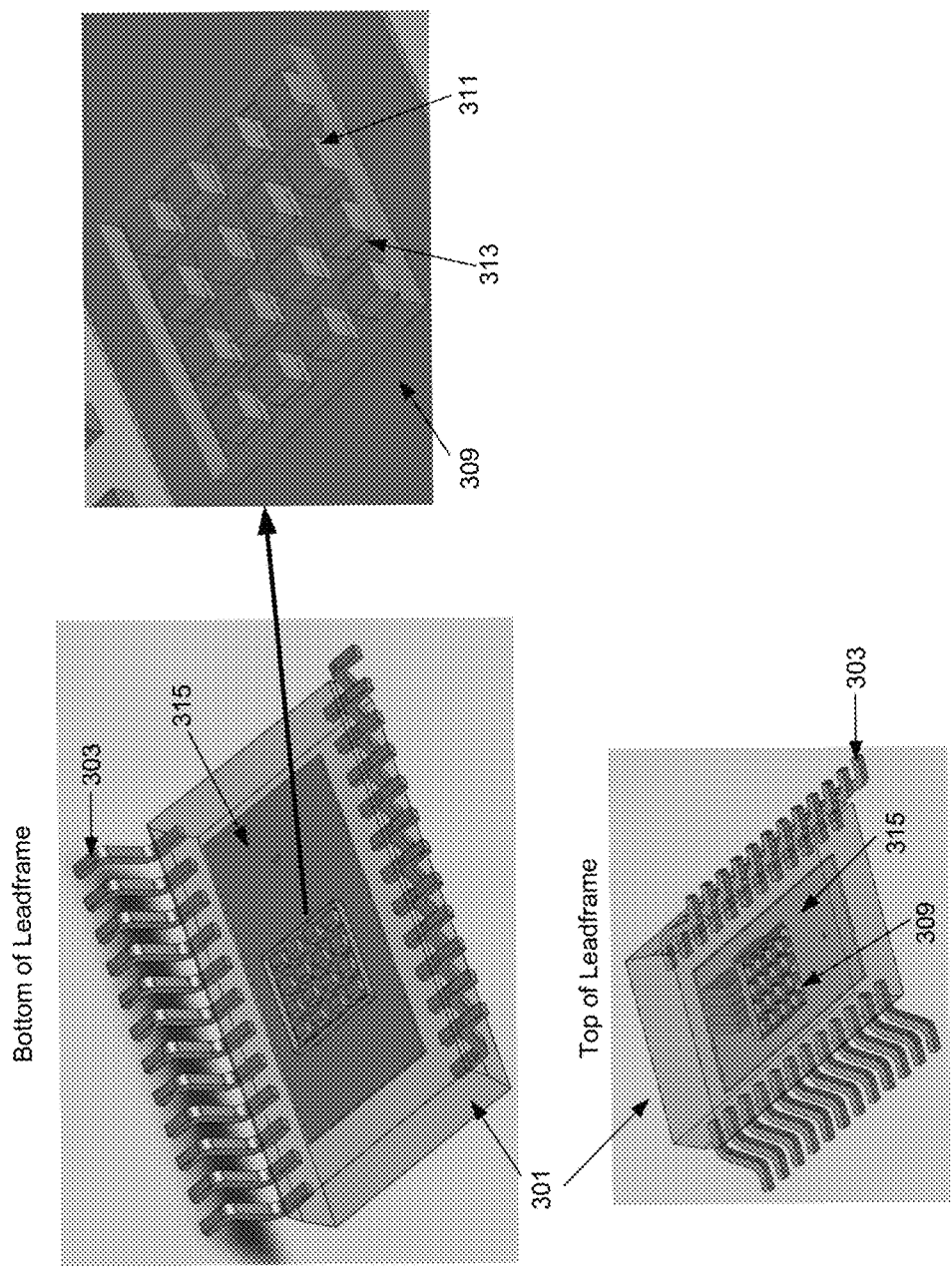
FIG. 3 is a drawing illustrating another arrangement for a vibration absorbing structure, in accordance with an example embodiment of the disclosure.

FIG. 3 is a drawing illustrating another arrangement for a vibration absorbing structure, in accordance with an example embodiment of the disclosure. Referring to FIG. 3, there is shown various views of a dampening array 309 integrated in the IC package 301. As with the array 209, the array 309 comprises an array of mass elements 311 formed on a softer material layer 313 on the leadframe 315, thereby forming a vibration absorbing structure for the IC package 301.

The array 309 may be formed on top or on bottom of the leadframe 315, as illustrated by the views on the left side of FIG. 3, although the disclosure is not so limited. Accordingly, the array 309 may be formed on entire surfaces, portions of surfaces, in symmetric patterns on both sides, or on one or more sides of an IC die, micro-electro-mechanical systems (MEMS) device, or application specific integrated circuit (ASIC) integrated in the package 301. Furthermore, the array 309 may be formed in an open cavity as opposed to being fully encapsulated in the IC package 301 or exposed via a window or hole in the encapsulant, for example.

In an example scenario, the array 309 may act as a dampening mechanism, or absorbing structure, for vibrations in the IC package 301, and may be attached to one or more surfaces of the leadframe 315, that may be used to form the leads 303, for example. The array 309 may dampen vibrations by extracting energy from motion imparted to the IC package 301 and may configure the natural resonance frequencies of the IC package 301. This may both decrease the vibration intensities and configure the resonance frequencies to fall within a desired or specified frequency range.

Figure 4:
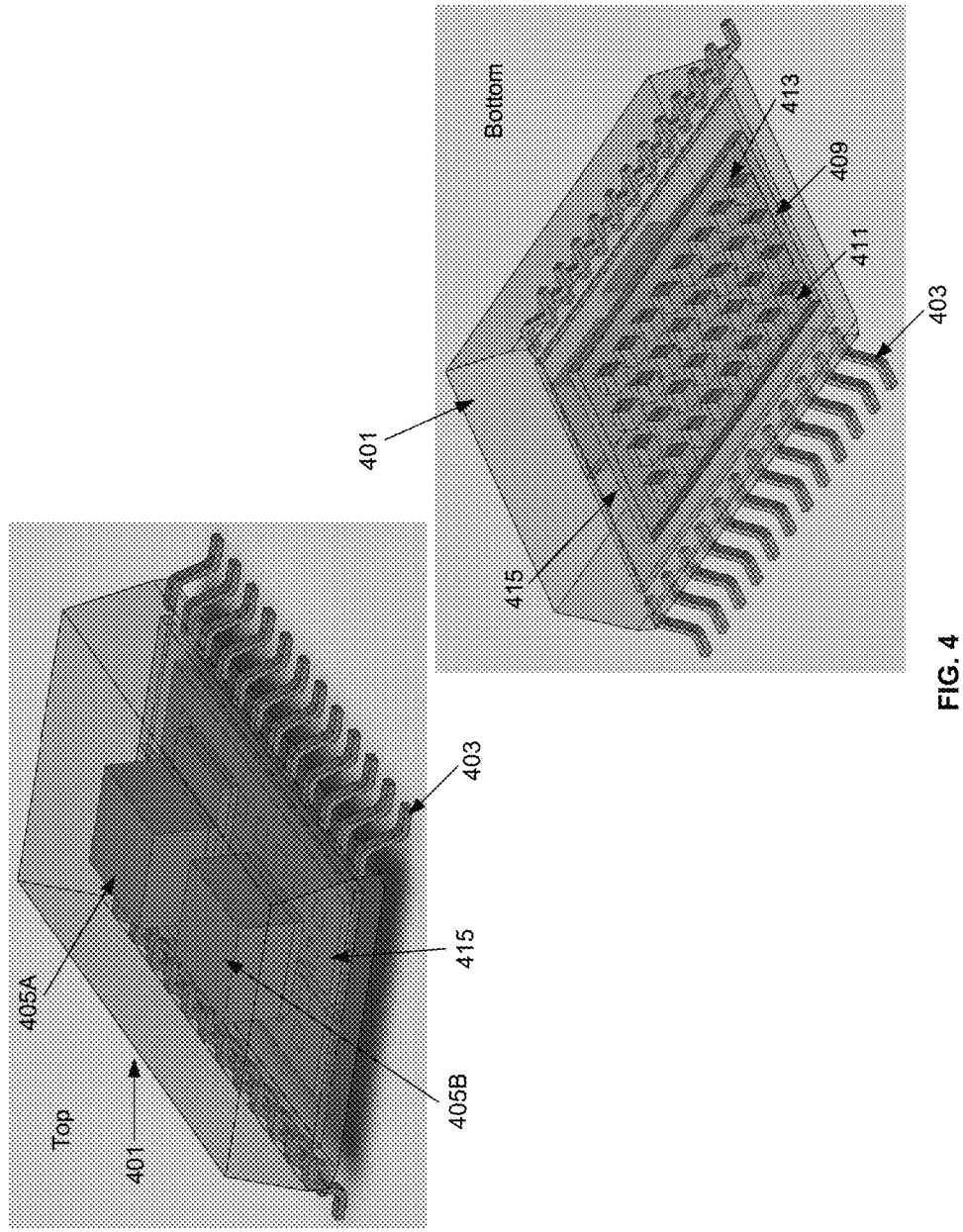
FIG. 4 is drawing illustrating another arrangement for a vibration absorbing structure, in accordance with an example embodiment of the disclosure.

FIG. 4 is drawing illustrating another arrangement for a vibration absorbing structure, in accordance with an example embodiment of the disclosure. Referring to FIG. 4, there is shown various views of a dampening array 409 integrated in the IC package 401. As with the array 209 and 309, the array 409 may comprise an array of mass elements 411 formed on a softer material layer 413 on the leadframe 415, thereby forming a vibration absorbing structure, for the IC package 401.

There is also shown IC die 405A and 405B, which may comprise ASICs, MEMS devices, or discrete components, for example. The array 409 may be formed at most of the area below the IC die 405A and 405B, as shown in FIG. 4, although the disclosure is not so limited. Accordingly, the array 409 may be formed on entire surfaces, portions of surfaces, in symmetric patterns on both sides, or on one or more sides of an IC die, micro-electro-mechanical systems (MEMS) device, or application specific integrated circuit (ASIC) integrated in the package 401. Furthermore, the array 409 may be formed in an open cavity as opposed to being fully encapsulated in the IC package 401.

In an example scenario, the array 409 may act as a dampening mechanism, or absorbing structure, for vibrations in the IC package 401, and may be attached to one or more surfaces of the leadframe 415, that may be used to form the leads 403, for example. The array 409 may dampen vibrations by extracting energy from motion imparted to the IC package 401 and may also configure the resonance frequencies to fall within a desired or specified frequency range.

Figure 5:
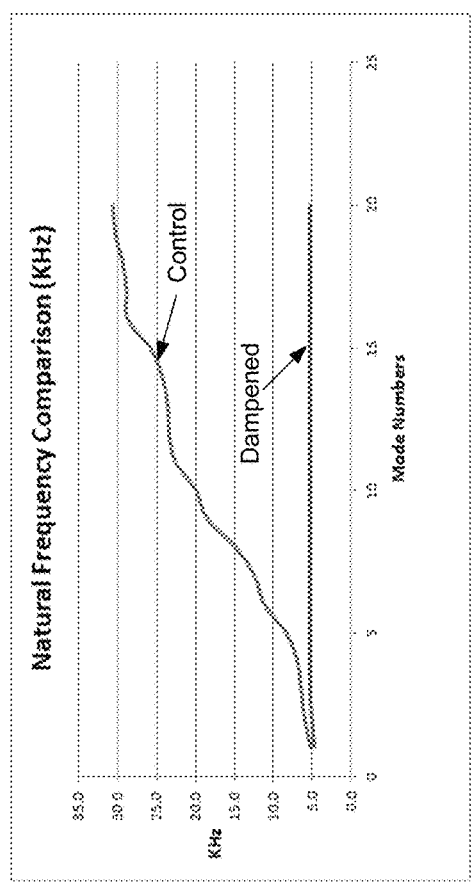
FIG. 5 is a drawing illustrating modeling results for an integrated vibration absorbing structure, in accordance with an example embodiment of the disclosure.
Figure 5:
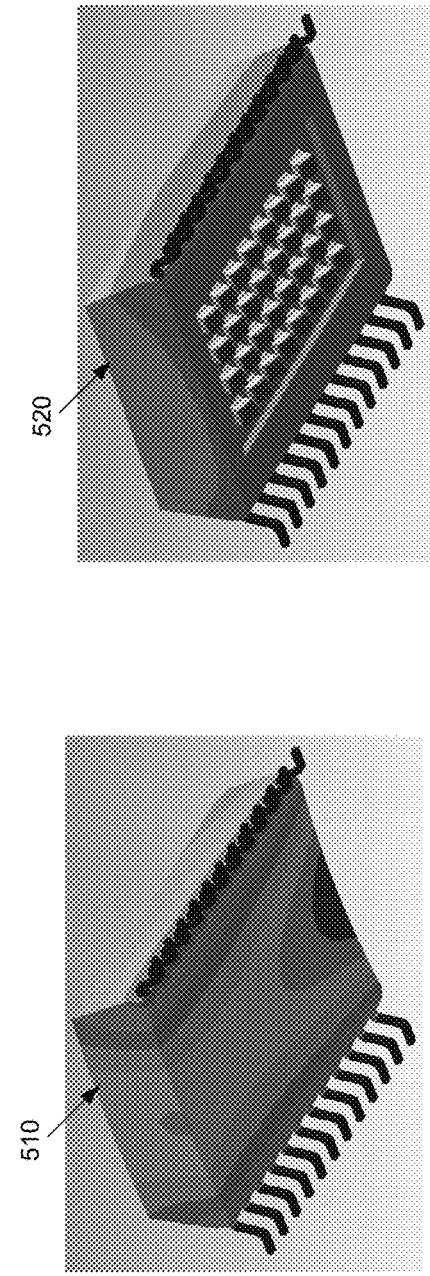

FIG. 5 is a drawing illustrating modeling results for an integrated vibration absorbing structure, in accordance with an example embodiment of the disclosure. Referring to FIG. 5, there is shown a conventional package 510 and a package 520 with an integrated vibration absorbing structure comprising an array of mass elements on softer material layers. The natural frequency of the conventional package 510 is labeled as "Control" in the frequency plot, while the integrated absorbing structure package 520 is labeled as "Dampened." As shown in the frequency plot, the natural frequency of the conventional package 510 increases with mode number, increasing to approximately 30 kHz for mode number 20, whereas the natural frequency of the integrated vibration absorbing structure package 520 shows a flat natural frequency of 5 kHz for all modes 1-20.

The shading in the oblique views of the conventional package 510 and the integrated vibration absorbing structure package 520 shows where the strain from vibration energy is absorbed. In the conventional package 510, the darker shading shows large amounts of vibration energy in the package near the center at one edge. However, in the integrated vibration absorbing structure package 520, the dark shaded regions are confined to the absorbing structure with very little vibration strain in the remaining regions of the package.

Figure 6:
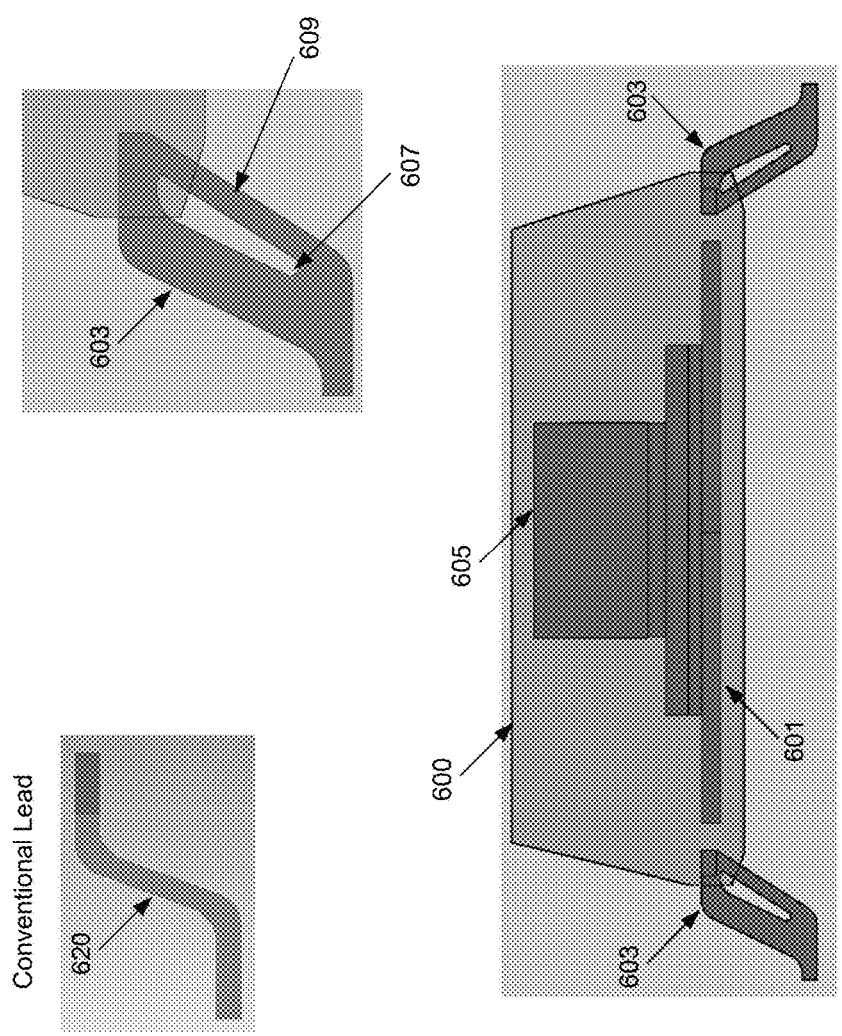
FIG. 6 is a drawing illustrating vibration control through stiffened (e.g., supported) package leads, in accordance with an example embodiment of the disclosure

FIG. 6 is a drawing illustrating vibration control through stiffened package leads, in accordance with an example embodiment of the disclosure. Referring to FIG. 6, there is shown an IC package 600 comprising a leadframe 601, supported leads 603, and an integrated device 605. There is also shown, in the upper figures, a conventional lead 620 and the supported lead 603.

As seen in FIG. 6, the supported lead 603 comprises a hole 607, resulting in a biaxial lead structure, with the added structure of the support 609, resulting in enhanced rigidity, reducing the vibrations transmitted to the package 600. This enhanced stiffness from the support 609 pushes the fundamental resonance frequency of the package higher (e.g., above the primary sources of excitation).

The natural frequency of a structure is a function of the stiffness and mass given by the relation $$\omega = \sqrt{\frac{k}{m}}$$

Where k is the stiffness and m is the mass. The supported leads 603 shown in FIG. 6 increase k, or stiffness, and enable configuration of the natural frequency of the package without any modifications required to the package itself.

Figure 7:
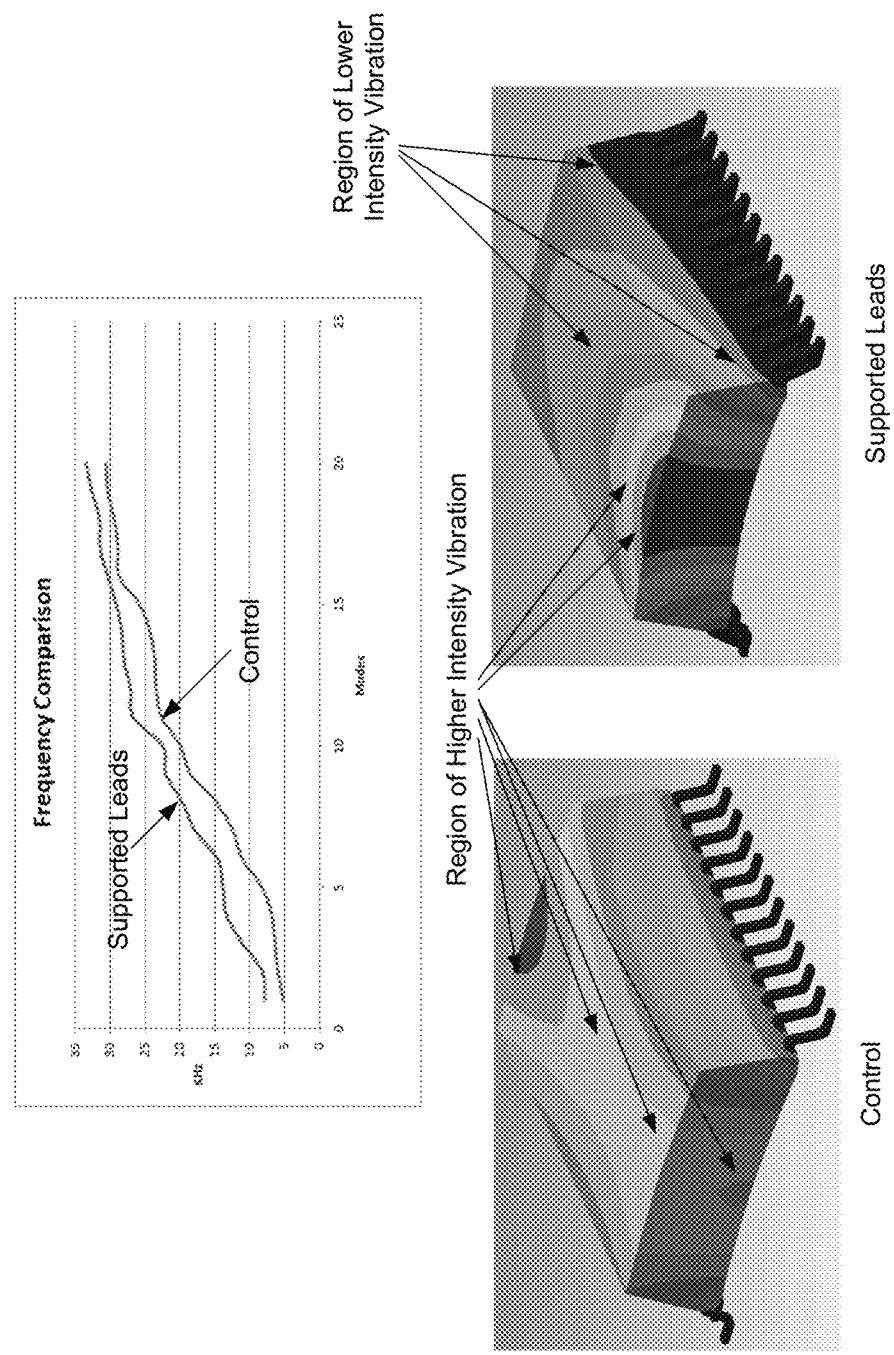
FIG. 7 is a drawing illustrating modeling results for a conventional package and a package with supported leads, in accordance with an example embodiment of the present disclosure.

FIG. 7 is a drawing illustrating modeling results for a conventional package and a package with supported leads, in accordance with an example embodiment of the present disclosure. Referring to FIG. 7, there is shown images of modeling results, the upper figure showing a graph of natural frequency of a conventional package, labeled as "Control" and a supported lead package, labeled as "Supported Leads." As shown in the graph, the natural frequency is increased significantly for all modes.

The lower oblique views show graphical representations of the vibration intensities of the package geometries, with the supported leads structure showing only a localized higher intensity vibration, whereas the control structure has relatively high vibration intensity throughout the structure. Furthermore, the addition of stiffer leads provided by the two-legged structure may not necessarily reduce a vibration intensity of a given mode or frequency, but may shift the natural frequencies of the package as required by a device standard or specification.

Thus, by utilizing vibration absorbing structures and supported leads, the natural resonance frequencies as well as vibration intensities of semiconductor packages may be configured.

Figure 8:
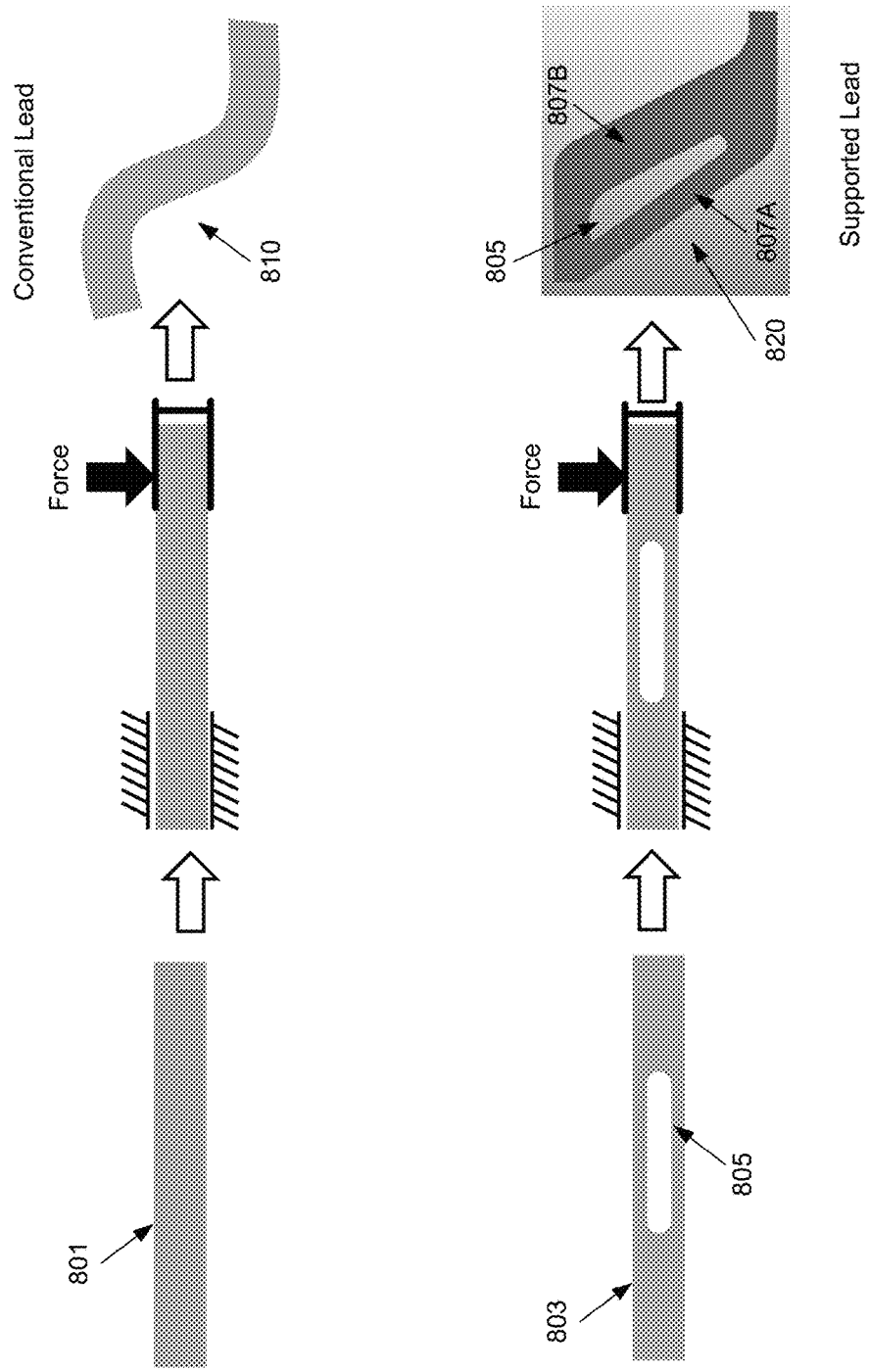
FIG. 8 illustrates fabrication processes for conventional leads and supported leads, in accordance with an example embodiment of the disclosure.

FIG. 8 illustrates fabrication processes for conventional leads and supported leads, in accordance with an example embodiment of the disclosure. Referring to FIG. 8, there is shown a conventional lead 810 and a supported lead 820, which may also be referred to as a supported gull wing lead.

For a conventional lead, source metal 801 may be supported at one end while force is applied at the other end. In this manner, the source metal 801 is formed into a conventional lead 810.

In an example scenario, a source metal 803 may comprise a hole 805 so that the source metal has two separate horizontal legs. It should be noted that the thicknesses of the legs are for illustration purposes only and do not indicate the actual thickness of each leg, as this may be dictated by packaging standards or specifications, for example. When the source metal 803 is supported at one end and a force is applied at the other end, as shown in the middle figure on bottom, a supported lead 820 with two legs 807A and 807B may result, as shown in the lower right figure. The stiffness improvement, and thus configuration of the package natural resonance frequencies, from incorporating supported leads may be configured with varying thicknesses for the legs 807A and 807B.

The supported lead structure 820 with legs 807A and 807B may result in increased stiffness, increasing the natural resonance frequency of the package utilizing the supported lead 820.

Figure 9:
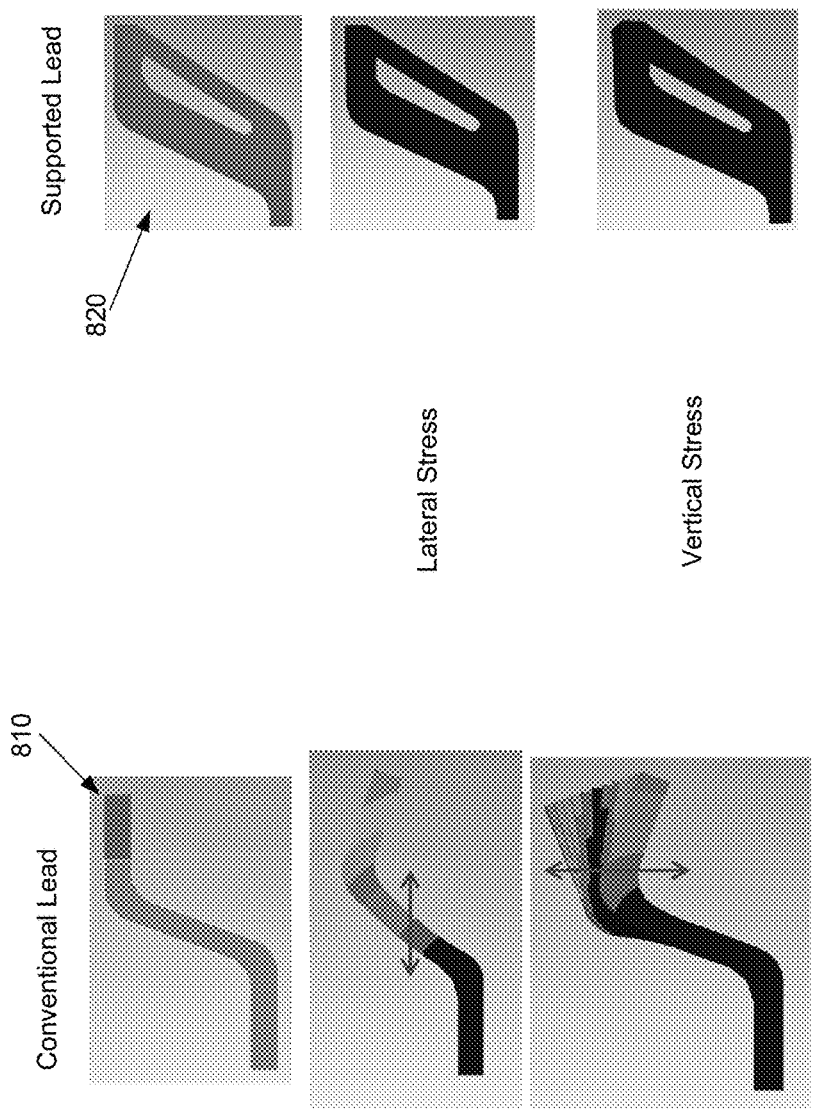
FIG. 9 illustrates modeled strain results for a conventional lead and a supported lead, in accordance with an example embodiment of the disclosure.

FIG. 9 illustrates modeled strain results for a conventional lead and a supported lead, in accordance with an example embodiment of the disclosure. Referring to FIG. 9, there is shown a conventional lead 810 and a supported lead 820, with the top row showing the leads before stress is applied. The middle row shows the conventional lead 810 and the supported lead 820 subject to lateral stress. The conventional lead 810 shows excessive strain resulting in some deformation of the lead whereas the supported lead 820 does not suffer from such deformation.

Similarly, the bottom row shows the conventional lead 810 and the supported lead 820 subject to vertical stress. As before, the conventional lead 810 shows excessive strain resulting in some deformation of the lead, whereas the supported lead 820 does not show any deformation.

In an embodiment of the disclosure, methods and apparatus are disclosed for an embedded vibration management system and may comprise fabricating a semiconductor package with integrated vibration management, where the fabricating comprises: forming an array of vibration absorbing structures; placing the array of vibration absorbing structures proximate to a leadframe comprising two-legged supported leads; placing a semiconductor device above the leadframe; and encapsulating the semiconductor device and the leadframe.

Each vibration absorbing structure may comprise a mass element formed on a material with lower density than the material of the mass element. The array of vibration absorbing structures may be placed on a top surface, on a bottom surface or both the top and bottom surface of the leadframe. Sections of the array of vibration absorbing structures may be placed symmetrically with respect to the semiconductor device. The vibration absorbing structures may be cubic in shape.

The vibration absorbing structures may be enclosed in an encapsulating material. The two-legged supported leads may be formed by bending metal strips with holes. The vibration absorbing structures may be exposed to the exterior of the semiconductor package.

While the disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A semiconductor package comprising:
   a leadframe;
   a semiconductor device above the leadframe;
   an encapsulant material encapsulating the semiconductor device and the leadframe; and
   an array of vibration absorbing structures, which does not comprise electrical contacts of the semiconductor package, wherein each of the vibration absorbing structures in the array of vibration absorbing structures does not provide any electrical connection with any other devices within the semiconductor package and is on a surface of the leadframe opposite to a surface of the leadframe on which the semiconductor device is coupled, wherein at least two vibration absorbing structures of the array of vibration absorbing structures are positioned directly below the semiconductor device.

2. The package according to claim 1, wherein each of the vibration absorbing structures comprises a respective mass element on a respective material element with a lower density than of the respective mass element.

3. The package according to claim 1, comprising a second array of vibration absorbing structures on the surface of the leadframe on which the semiconductor device is coupled.

4. The package according to claim 1, wherein the array of vibration absorbing structures is encased in an encasing material separate from the encapsulant material encapsulating the semiconductor device and the leadframe.

5. The package according to claim 1, wherein the array of vibration absorbing structures has an area larger than that of the semiconductor device.

6. The package according to claim 1, wherein sections of the array of vibration absorbing structures are arranged symmetrically with respect to the semiconductor device in a two-dimensional array.

7. The package according to claim 1, wherein the vibration absorbing structures are cubic in shape.

8. The package according to claim 1, wherein the vibration absorbing structures are enclosed in the encapsulant material.

9. The package according to claim 1, wherein the vibration absorbing structures are exposed to the exterior of the semiconductor package.

10. The package according to claim 2, wherein the material with the lower density is closer to the leadframe than the mass element.

11. A semiconductor package comprising:
a leadframe comprising two-legged support leads, wherein each of the two-legged support leads comprises:
an inner leg with an outer surface and an outer leg with an inner surface; and
a hole bounded by the outer surface of the inner leg and the inner surface of the outer leg;
a semiconductor device attached to the leadframe; and
an encapsulant material encapsulating the semiconductor device and the leadframe, and defining first and second encapsulant sides opposite each other;
wherein for at least one of the two-legged support leads at the first encapsulant side, a shortest distance from the outer surface of the inner leg to the second encapsulant side is less than a shortest distance from the inner surface of the outer leg to the second encapsulant side.

12. A semiconductor package comprising:
a leadframe;
a semiconductor device supported by the leadframe;
an array of vibration absorbing structures, which does not have an electrical contact, on a second surface of the leadframe opposite to a first surface of the leadframe on which the semiconductor device is coupled, and wherein:
the array of vibration absorbing structures does not provide any electrical connection with any other device; and
the array of vibration absorbing structures is positioned directly below the semiconductor device;
an encapsulant encapsulating the semiconductor device and the leadframe.

13. The package according to claim 12, wherein the array of absorbing structures comprises a material other than molding material.

14. The package according to claim 12, wherein sections of the array of absorbing structures are arranged symmetrically with respect to the semiconductor device in a two-dimensional array.

15. The package according to claim 12, wherein the absorbing structures each comprise a mass element on a dampening material that is softer than the mass element.

16. The package according to claim 12, comprising a second vibration absorbing structure on the first surface of the leadframe.

17. The package according to claim 12, wherein the array of vibration absorbing structures is encased in an encasing material separate from the encapsulant material encapsulating the semiconductor device and the leadframe.

18. The package according to claim 12, wherein the array of vibration absorbing structures has an area larger than that of the semiconductor device.

19. The package according to claim 12, wherein the array of vibration absorbing structures is enclosed in the encapsulant material.

20. The package according to claim 12, wherein the array of vibration absorbing structures is exposed to the exterior of the semiconductor package.

21. The package according to claim 12, wherein the leadframe comprises a support lead having a hole therethrough, wherein the hole is in a plane that orthogonally intersects a longitudinal axis of the semiconductor package.

22. The package according to claim 21, wherein the support lead having a hole therethrough comprises a two-legged support lead.

23. The package according to claim 15, wherein the dampening material is closer to the leadframe than the mass element.

* * * * *